United States Patent
Chang et al.

(10) Patent No.: US 10,693,003 B2
(45) Date of Patent: Jun. 23, 2020

(54) INTEGRATED CIRCUIT TRANSISTOR STRUCTURE WITH HIGH GERMANIUM CONCENTRATION SIGE STRESSOR

(71) Applicant: Taiwan Semiconductor Manufacturing Company, Ltd., Hsinchu (TW)

(72) Inventors: Chih-Hao Chang, Chu-Bei (TW); Jeff J. Xu, Jhubei (TW); Chien-Hsun Wang, Hsinchu (TW); Chih Chieh Yeh, Taipei (TW); Chih-Hsiang Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 15/600,311

(22) Filed: May 19, 2017

(65) Prior Publication Data
US 2017/0263749 A1    Sep. 14, 2017

Related U.S. Application Data

(60) Continuation of application No. 14/102,702, filed on Dec. 11, 2013, now Pat. No. 9,660,082, which is a
(Continued)

(51) Int. Cl.
*H01L 29/78*      (2006.01)
*H01L 29/165*    (2006.01)
(Continued)

(52) U.S. Cl.
CPC .......... *H01L 29/785* (2013.01); *H01L 21/18* (2013.01); *H01L 29/161* (2013.01);
(Continued)

(58) Field of Classification Search
CPC ..... H01L 29/785; H01L 29/161; H01L 21/18; H01L 29/165; H01L 29/7848;
(Continued)

(56) References Cited

U.S. PATENT DOCUMENTS 7,018,901 B1 *   3/2006   Thean ................. H01L 21/2254
                                                                     257/E21.148
7,288,443 B2    10/2007   Zhu
(Continued)

FOREIGN PATENT DOCUMENTS

JP    2006019727    1/2006
JP    2006221628    8/2006

*Primary Examiner* — Hoang-Quan Ho
(74) *Attorney, Agent, or Firm* — Haynes and Boone, LLP

(57) ABSTRACT

An embodiment of a method for forming a transistor that includes providing a semiconductor substrate having a source/drain region is provided where a first SiGe layer is formed over the source/drain region. A thermal oxidation is performed to convert a top portion of the first SiGe layer to an oxide layer and a bottom portion of the first SiGe layer to a second SiGe layer. A thermal diffusion process is performed after the thermal oxidation is performed to form a SiGe area from the second SiGe layer. The SiGe area has a higher Ge concentration than the first SiGe layer.

20 Claims, 5 Drawing Sheets

Related U.S. Application Data division of application No. 12/831,842, filed on Jul. 7, 2010, now Pat. No. 8,623,728.

(60) Provisional application No. 61/229,253, filed on Jul. 28, 2009.

(51) Int. Cl.
*H01L 29/66* (2006.01)
*H01L 29/161* (2006.01)
*H01L 21/18* (2006.01)
*H01L 21/02* (2006.01)
*H01L 29/10* (2006.01)

(52) U.S. Cl.
CPC ...... *H01L 29/165* (2013.01); *H01L 29/66575* (2013.01); *H01L 29/66628* (2013.01); *H01L 29/7848* (2013.01); *H01L 21/0245* (2013.01); *H01L 21/02488* (2013.01); *H01L 21/02502* (2013.01); *H01L 21/02532* (2013.01); *H01L 29/1054* (2013.01); *H01L 29/66636* (2013.01); *H01L 29/66772* (2013.01); *H01L 29/66795* (2013.01)

(58) Field of Classification Search
CPC ......... H01L 29/66575; H01L 29/66628; H01L 29/66636; H01L 21/0245; H01L 29/66772; H01L 29/66795; H01L 29/1054; H01L 21/02532

See application file for complete search history.

(56) References Cited

U.S. PATENT DOCUMENTS

| | | |
|---|---|---|
| 7,987,158 B2 | 7/2011 | Boyd et al. |
| 9,276,112 B2 | 3/2016 | Bohr |
| 2005/0093154 A1* | 5/2005 | Kottantharayil .... H01L 29/1054 257/745 |
| 2006/0068553 A1* | 3/2006 | Thean ................ H01L 21/2254 438/285 |
| 2006/0151808 A1* | 7/2006 | Chen ................ H01L 21/26506 257/188 |
| 2008/0054347 A1 | 3/2008 | Wang et al. |

* cited by examiner

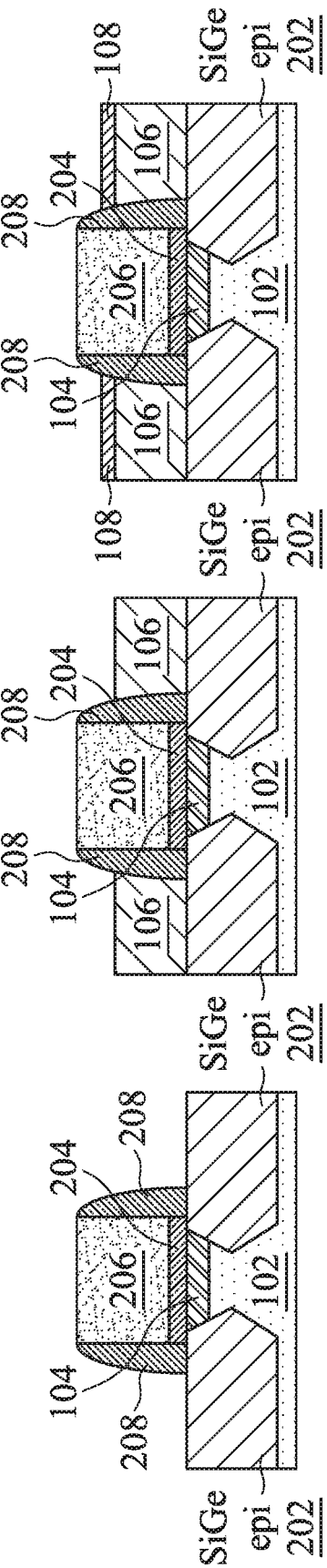
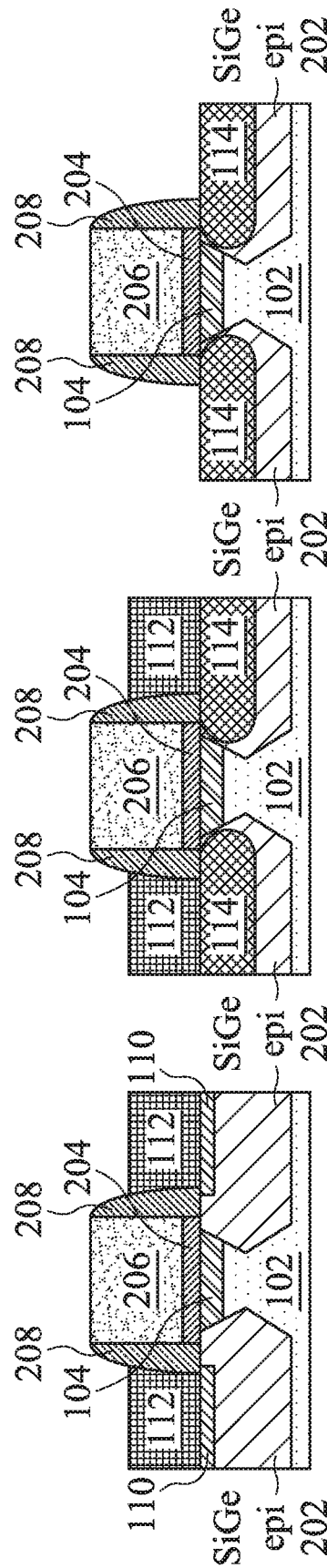

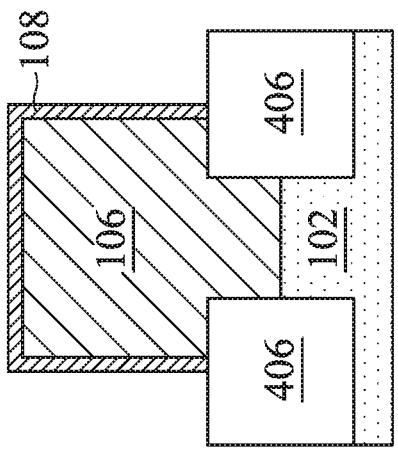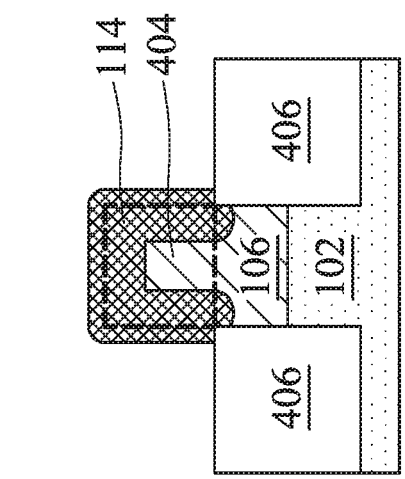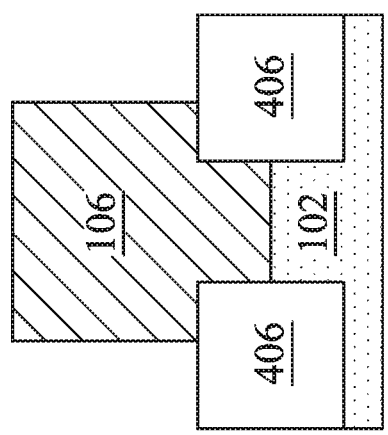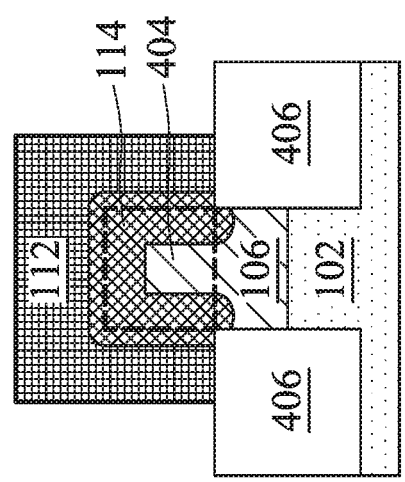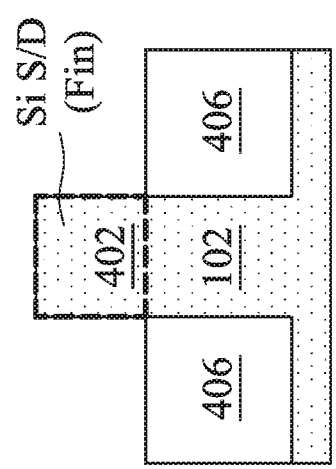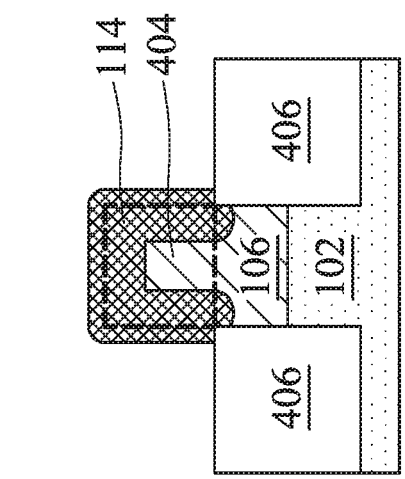

INTEGRATED CIRCUIT TRANSISTOR STRUCTURE WITH HIGH GERMANIUM CONCENTRATION SIGE STRESSOR

CROSS-REFERENCE TO RELATED APPLICATIONS

The present application is a continuation application of U.S. application Ser. No. 14/102,702, filed Dec. 11, 2013, which is a divisional of U.S. application Ser. No. 12/831,842, filed Jul. 7, 2010, which claims priority of U.S. Provisional Application No. 61/229,253, filed Jul. 28, 2009. The above-listed applications are incorporated herein by reference in their entireties.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTIFUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This disclosure relates generally to integrated circuits, and more particularly, to a SiGe source-drain stressor in a semiconductor transistor structure.

BACKGROUND

Strain engineering is employed in semiconductor manufacturing to enhance device performance. Performance benefits are achieved by modulating strain in the transistor channel, which enhances electron mobility (or hole mobility) and thereby conductivity through the channel.

In CMOS technologies, PMOS and NMOS respond differently to different types of strain. Specifically, PMOS performance is best served by applying compressive strain to the channel, whereas NMOS receives benefit from tensile strain. SiGe ($Si_{1-x}Ge_x$), consisting of any molar ratio of silicon and germanium, is commonly used as a semiconductor material in integrated circuits (ICs) as a strain-inducing layer for strained silicon in CMOS transistors.

Strained silicon is a layer of silicon in which the silicon atoms are stretched beyond their normal inter atomic distance. This can be accomplished by putting the layer of silicon over a substrate of silicon germanium (SiGe), for example. As the atoms in the silicon layer align with the atoms of the underlying silicon germanium layer, which are arranged farther apart with respect to those of a bulk silicon crystal, the links between the silicon atoms become stretched—thereby leading to strained silicon.

Currently, the PMOS strain is realized by undercutting the source/drain area and epitaxially growing SiGe film in the undercut region. The larger lattice constant of the SiGe film provides the uniaxial strain to the Si channel. The higher the Ge concentration, the larger the strain and thus better performance. However, the Ge incorporation into the SiGe film is limited by the epitaxial process. Very high Ge concentration SiGe film is difficult to realize using the conventional epitaxial method, which is extremely sensitive to surface preparation, pre-cursors used and growth conditions. It is challenging to meet the ever-increasing Ge concentration requirement and maintain proper control of the SiGe profile for the SiGe source/drain (S/D) in PMOS with epitaxial growth.

BRIEF DESCRIPTION OF THE DRAWINGS

For a more complete understanding of exemplary embodiments of the present invention, and the advantages thereof, reference is now made to the following descriptions taken in conjunction with the accompanying drawings, in which:

FIG. 2A-FIG. 2F illustrate one embodiment of the process for a planar device with strained source drain (SSD);

FIG. 4A-FIG. 4F illustrate one embodiment of the process for a FinFET or Trigate device with strained source drain (SSD)

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for producing a SiGe stressor with high Ge concentration is provided. This method converts a SiGe film with low Ge concentration into a SiGe film with very high Ge concentration, without the need to epitaxially form a high Ge concentration source/drain (S/D). By having a separate oxidation step and diffusion step for the condensation process, high Ge concentration SiGe profile can be formed and properly controlled. This method is applicable to both planar and FinFET devices on either bulk Si or SOI (silicon on insulator) substrate. Throughout the various views and illustrative embodiments of the present invention, like reference numbers are used to designate like elements.

Figure 1A:
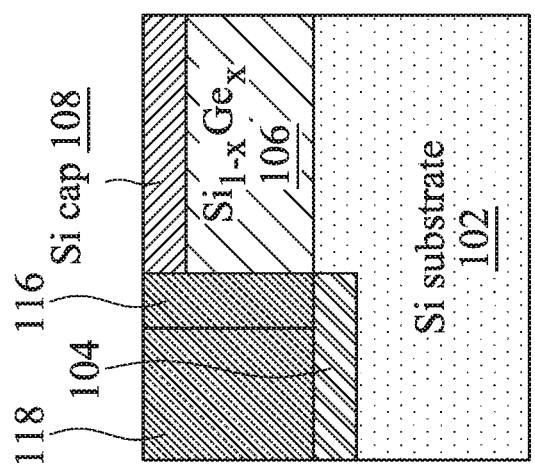
FIG. 1A-FIG. 1C illustrate an exemplary process for SiGe stressor with high Ge concentration according to one embodiment of this invention.
Figure 1B:
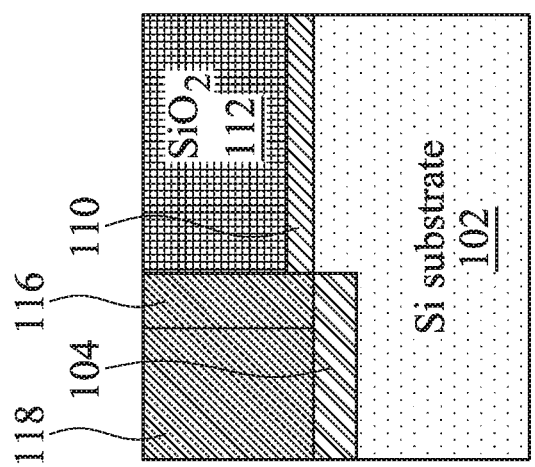
Figure 1C:
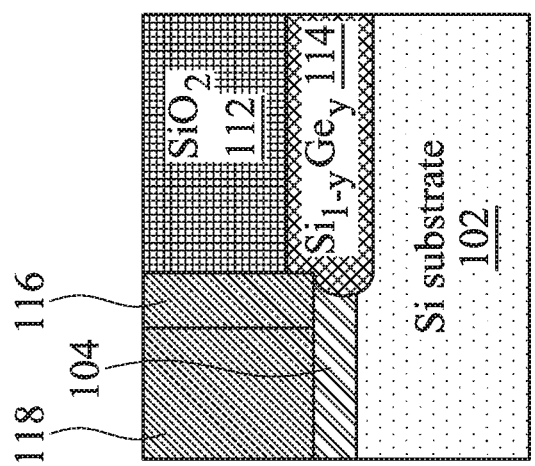

FIGS. 1A-1C illustrate an exemplary process for a SiGe stressor with high Ge concentration. In FIG. 1A, a SiGe film layer 106 and a Si cap layer 108 are deposited on the Si substrate 102 (the substrate 102 can also be SiGe substrate or relaxed SiGe film on Si substrate) beside spacer layer 116 in the S/D area. The channel area 104 below the gate 118 can comprise Si or SiGe channel. The Si cap layer 108 serves as the starting point for oxidation. The oxide quality of a SiGe film in general can be poor and its oxidation front can be hard to control without the Si cap layer 108. Having the Si cap layer 108 helps to form a uniform oxide layer 112 to begin with and makes the overall condensation profile easier to control.

In FIG. 1B, a low temperature thermal oxidation (dry or wet, preferably wet to lower the temperature) is performed to form a localized high Ge percentage SiGe film 110 at the bottom interface with little or completely without Ge diffusion through SiGe/Si interface into the substrate 102. This thermal oxidation step can also comprise at least two stages each with different temperatures and durations to ensure little to no Ge diffusion during the process. In FIG. 1C, a thermal diffusion is performed to form SiGe stressor 114 with the desired profile and depth. Later, the top oxide layer 112 is removed and regular processing can continue. The oxidation and thermal diffusion steps can be combined and performed simultaneously if an optimal temperature can be identified to simultaneously achieve oxidation and desired diffusion profile.

The SiGe film layer 106 has a composition ratio of Si:Ge=1−x:x (i.e., $Si_{1-x}Ge_x$), while the condensed SiGe stressor film 114 has a composition ratio of Si:Ge=1−y:y (i.e. $Si_{1-y}Ge_y$), where x and y represent the Ge percentage in each SiGe film (y>x). The SiGe stressor layer 114 has a higher Ge concentration than deposited SiGe film layer 106, and applies uniaxial compressive strain to the channel 104.

By having a separate (low-temperature) oxidation step and a Ge diffusion step for the condensation process, a higher Ge concentration profile in SiGe S/D stressor film 114 can be formed and properly controlled from the originally deposited SiGe film 106 having a low Ge concentration percentage. Low temperature thermal oxidation (e.g., below 800° C. for x<0.5 and below 600° C. for x approaching 1, where x is the number in $Si_{1-x}Ge_x$) that does not incur Ge diffusion is to obtain a localized, non-diffused high Ge percentage SiGe film 110. This can be achieved through high water vapor pressure wet oxidation, for example.

The two-step process of oxidation and diffusion eliminates the need for silicon on insulator (SOI) substrate in the conventional condensation process, which relies on the presence of oxide to block uncontrolled Ge diffusion. Disclosed embodiments of the present invention are also applicable to three-dimensional (3D) structures. The condensed high Ge concentration SiGe stressor area 114 is naturally close to the surface channel 104, resulting in effective strain on the device channel. Also, disclosed embodiments of the present invention work on high Ge percentage SiGe channel (e.g., $Si_{0.5}Ge_{0.5}$) devices, which by itself alone cannot compete performance-wise against a typical uniaxial strained Si device without further stress from the S/D.

FIGS. 2A-2F illustrate one embodiment of the process for a planar device with strained source drain (SSD). In FIG. 2A, the process starts with SSD and SiGe epi layer 202. The substrate 102, channel 104, dielectric layer 204, gate 206, and sidewall spacer 208 are also shown. In FIG. 2B, a SiGe film 106 (Ge concentration can be either higher or lower than that of 202) is deposited on top of the SiGe epi layer 202. Optionally, a Si cap layer 108 is deposited on top of the SiGe film 106 to help uniform oxidation as shown in FIG. 2C. After low temperature oxidation in FIG. 2D, high Ge percentage SiGe film 110 and oxidation layer 112 are formed. In FIG. 2E, thermal diffusion is performed to form a condensed high Ge concentration SiGe stressor film 114. The Ge concentration of the SiGe film 114 is higher than the original SiGe epi layer 202. In FIG. 2F, the oxide layer 112 can be removed.

Figure 3A:
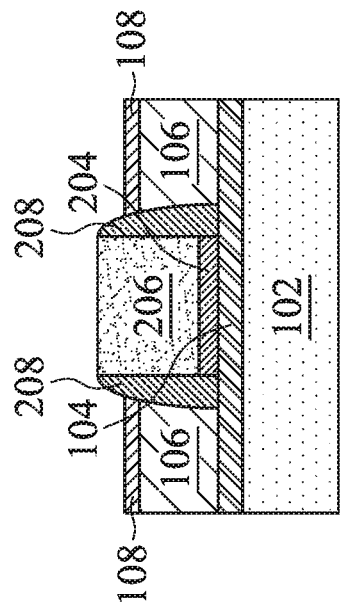
FIG. 3A-FIG. 3F illustrate another embodiment of the process for a planar device without SSD.
Figure 3B:
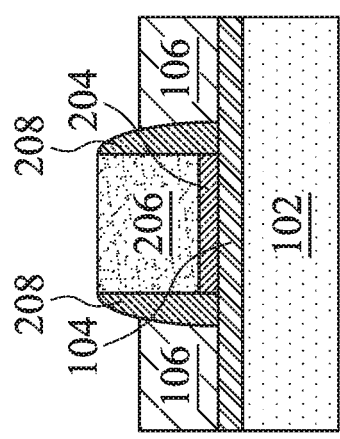
Figure 3C:
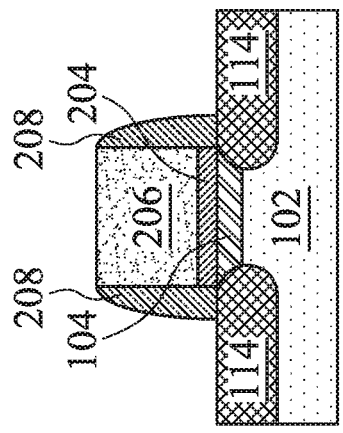
Figure 3D:
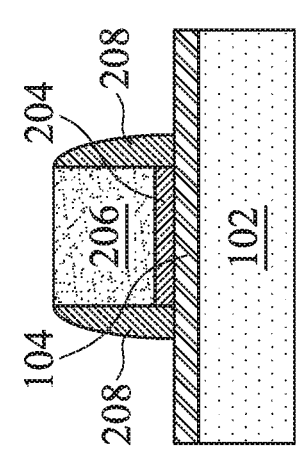
Figure 3E:
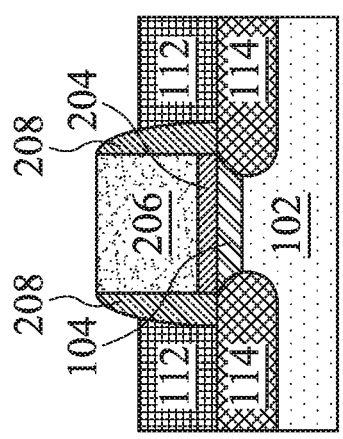
Figure 3F:
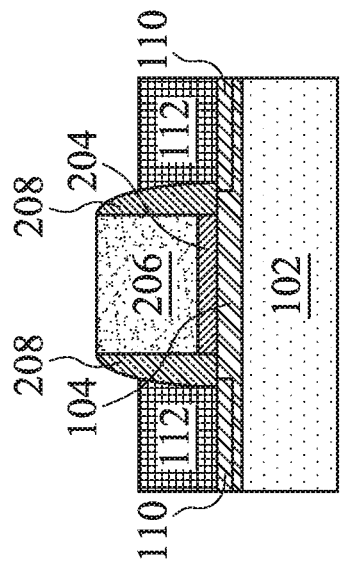

FIGS. 3A-3F illustrate another embodiment of the process for a planar device without SSD according to one aspect of this invention. In FIG. 3A, the process starts without SSD. The substrate 102, channel layer 104, dielectric layer 204, gate 206, and sidewall spacer 208 are shown. In FIG. 3B, a SiGe film 106 is deposited on top of the channel layer 104. Optionally, a Si cap layer 108 is deposited on top of the SiGe film 106 to help uniform oxidation as shown in FIG. 3C. After low temperature oxidation in FIG. 3D, high Ge percentage SiGe film 110 and oxidation layer 112 are formed. In FIG. 3E thermal diffusion is performed to form a condensed high Ge concentration SiGe stressor 114. In FIG. 3F, the oxide layer 112 can be removed.

FIGS. 4A-4F illustrate one embodiment of the process for a FinFET device with strained source drain (SSD). FIG. 4A shows a cross section of Si S/D fin area 402 on substrate 102 and shallow trench isolation 406 along a gate direction. In FIG. 4B, anisotropic SSD etch and SiGe epi growth processes are performed on the Si S/D fin area 402 on top of Si substrate 102 to form SiGe film layer 106. In FIG. 4C, a Si cap layer 108 can be optionally deposited on top of the SiGe film 106 to help uniform oxidation. After low temperature oxidation in FIG. 4D, high Ge percentage SiGe film 110 and oxidation layer 112 are formed over the fin area 404. In FIG. 4E, thermal diffusion is performed to form a condensed high Ge concentration SiGe stressor 114. The Ge concentration of the SiGe stressor 114 is higher than the SiGe film 106. It is also possible that the entire S/D area, 404, is uniformly converted to higher Ge concentration SiGe (i.e., 404=114). In FIG. 4F, the oxide layer 112 can be removed.

Figure 5A:
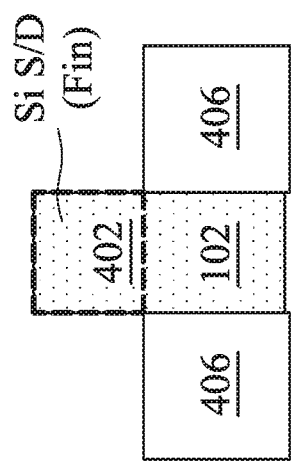
FIG. 5A-FIG. 5F illustrate another embodiment of the process for a FinFET or Trigate device without SSD.
Figure 5B:
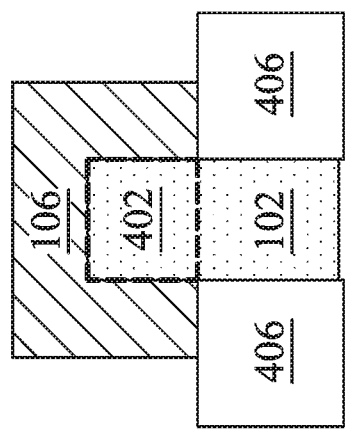
Figure 5C:
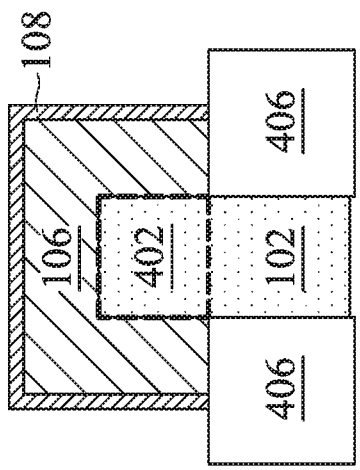
Figure 5D:
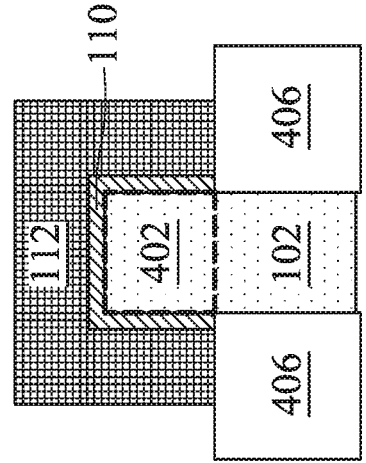
Figure 5E:
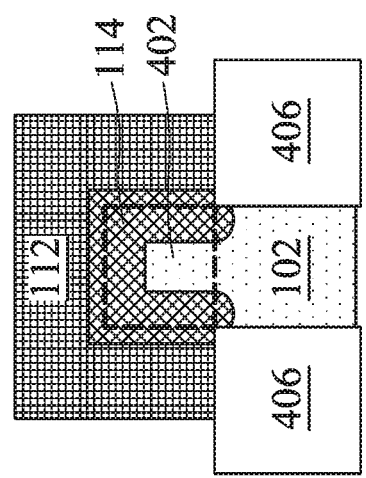
Figure 5F:
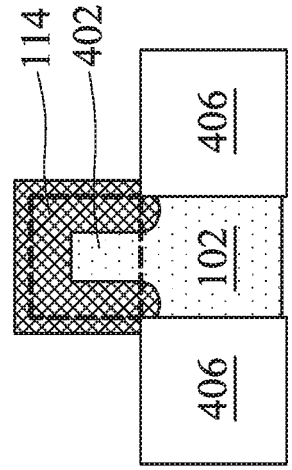

FIGS. 5A-5F illustrate another embodiment of the process for a FinFET device without SSD. FIG. 5A shows a cross section of Si S/D fin area 402 on substrate 102 and shallow trench isolation 406 along a gate direction. In FIG. 5B, a SiGe film layer 106 is grown over the Si S/D Fin area 402 on top of Si substrate 102. In FIG. 5C, a Si cap layer 108 can be optionally deposited on top of the SiGe film 106 to help uniform oxidation. After low temperature oxidation in FIG. 5D, high Ge percentage SiGe film 110 and oxidation layer 112 are formed over the fin area 402. In FIG. 5E, thermal diffusion is performed to form a condensed high Ge concentration SiGe stressor 114. The Ge concentration of the SiGe stressor 114 is higher than the SiGe film 106. Again, it is possible that the entire S/D area, 404, is uniformly converted to higher Ge concentration SiGe. In FIG. 5F, the oxide layer 112 can be removed.

The advantageous features of disclosed embodiments of the present invention include much higher uniaxial compressive stress on the channel achieved without redeveloping a SiGe process that relieves the pressure of forming higher and higher Ge concentration SiGe film with epitaxy, and the elimination of critical thickness constraint, i.e., strained source drain (SSD) depth. Also, the present methods can provide additional uniaxial strain from higher Ge concentration SiGe S/D on SiGe channel on Si substrate structure that already has biaxial strain (e.g., $Si_{0.5}Ge_{0.5}$ channel with SiGe S/D having Ge greater than 50%). A skilled person in the art will appreciate that there can be many embodiment variations.

In some embodiments, an integrated circuit transistor structure comprises a semiconductor substrate, a first SiGe layer in at least one of a source area or a drain area on the semiconductor substrate, and a channel between the source area and the drain area. The first SiGe layer has a Ge concentration of 50 percent or more.

In some embodiments, an integrated circuit transistor structure comprises a semiconductor substrate, a fin structure over the semiconductor substrate, and a first SiGe layer over top and side surfaces of the fin structure.

In some embodiments, an integrated circuit transistor structure comprises a semiconductor substrate, a first SiGe layer over an active region of the semiconductor substrate, and a second SiGe layer under the first SiGe layer. The second SiGe layer has a lower Ge concentration than the first SiGe layer.

Although exemplary embodiments of the present invention and their advantages have been described in detail, it should be understood that various changes, substitutions and alterations can be made herein without departing from the spirit and scope defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for forming a transistor, said method comprising:
   providing a semiconductor substrate having a source/drain region disposed in a fin extending from the semiconductor substrate;
   removing a portion of the fin in the source/drain region to form a remaining fin;
   forming a first SiGe layer over the remaining fin in the source/drain region;
   performing a thermal oxidation to convert a top portion of the first SiGe layer to an oxide layer and a bottom portion of the first SiGe layer to a second SiGe layer; and
   performing a thermal diffusion process after the thermal oxidation is performed, to form a SiGe area from the second SiGe layer, wherein the SiGe area has a higher Ge concentration than the first SiGe layer.

2. The method of claim 1, wherein the providing the semiconductor substrate having the source/drain region includes:
   epitaxially growing an epitaxial SiGe region, wherein the first SiGe layer is disposed on the epitaxial SiGe region.

3. The method of claim 2, further comprising:
   wherein after the performing the thermal diffusion process to form the SiGe area, the SiGe area has an interface with a remaining portion of the epitaxial SiGe region.

4. The method of claim 1, wherein the providing the semiconductor substrate having the source/drain region includes: providing the semiconductor substrate with a channel region extending from the source/drain region to under a gate, wherein the first SiGe layer is formed over the channel region.

5. The method of claim 4, wherein the first SiGe layer is formed directly interfacing the channel region.

6. The method of claim 4, further comprising:
   providing a gate over a portion of the channel region, the gate having sidewall spacers.

7. The method of claim 6, wherein the SiGe area extends under the sidewall spacers.

8. The method of claim 1, further comprising:
   wherein a top surface of the remaining fin is below an adjacent isolation structure.

9. The method of claim 1, further comprising:
   growing an epitaxial SiGe film on the top surface of the remaining fin to form the first SiGe layer.

10. The method of claim 1, wherein the thermal oxidation process is performed at less than 800 degrees Celsius.

11. The method of claim 1, wherein the thermal oxidation process is performed at less than 600 degrees Celsius.

12. The method of claim 1, wherein the first SiGe layer is formed over an isolation feature abutting the fin.

13. A method, comprising:
   depositing a first SiGe layer over a fin extending from a semiconductor substrate and the first SiGe layer disposed over a shallow trench isolation abutting the fin;
   depositing a Si cap layer on the first SiGe layer;
   performing a thermal oxidation to convert a top portion of the first SiGe layer and the Si cap layer to an oxide layer and to convert a bottom portion of the first SiGe layer to a second SiGe layer; and
   performing a thermal diffusion process after the thermal oxidation is performed to form a SiGe stressor from the second SiGe layer, wherein the SiGe stressor has a higher Ge percentage than the first SiGe layer.

14. The method of claim 13, wherein the thermal diffusion process is separate from the thermal oxidation.

15. The method of claim 13, wherein the depositing the first SiGe layer over the fin includes depositing the first SiGe layer over a source/drain region of the fin.

16. The method of claim 13, wherein the SiGe stressor abuts a top surface of the shallow trench isolation.

17. A method for forming a fin-type field effect transistor, comprising:
   providing a fin structure extending from a substrate;
   forming a first SiGe layer over a top surface and side surfaces of the fin structure;
   performing a thermal oxidation to convert a top portion of the first SiGe layer to an oxide layer and to convert a bottom portion of the first SiGe layer to a second SiGe layer, wherein the thermal oxidation process is performed below 800° Celsius, wherein the thermal oxidation forms the second SiGe layer on a first thickness; and after performing the thermal oxidation, in a separate step from the thermal oxidation process, performing a thermal diffusion on the substrate including the second SiGe layer to form a SiGe stressor layer, wherein the forming the SiGe stressor layer includes consuming at least a portion of the fin structure and the second SiGe layer, the SiGe stressor layer having a second thickness greater than the first thickness.

18. The method of claim 17, further comprising:
forming a Si cap layer over the first SiGe layer prior to the performing the thermal oxidation.

19. The method of claim 17, wherein the thermal oxidation is performed below 600° Celsius.

20. The method of claim 17, wherein the thermal oxidation provides little to no diffusion of the Ge.

* * * * *